(12) United States Patent
Unno (10) Patent No.: US 8,138,516 B2
(45) Date of Patent: Mar. 20, 2012

(54) LIGHT EMITTING DIODE

(75) Inventor: Tsunehiro Unno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 13/045,598

(22) Filed: Mar. 11, 2011

(65) Prior Publication Data

US 2011/0233587 A1     Sep. 29, 2011

(30) Foreign Application Priority Data

Mar. 24, 2010   (JP) ................................ 2010-067341

(51) Int. Cl.
    *H01L 33/22* (2010.01)
(52) U.S. Cl. .............. 257/98; 257/13; 257/79; 257/103; 257/918; 257/E33.074; 257/E33.072; 257/E51.022; 257/E33.001; 257/E33.077; 257/E51.018
(58) Field of Classification Search ................ 257/98, 257/13, 79, 103, E33.074, E33.072, E51.018, 257/E51.022, E33.001, E33.077
    See application file for complete search history.

(56) References Cited

U.S. PATENT DOCUMENTS

| 2005/0253151 | A1   | 11/2005 | Sakai et al. |        |
|--------------|------|---------|--------------|--------|
| 2009/0179207 | A1 * | 7/2009  | Chitnis et al. | 257/88 |
| 2009/0206354 | A1 * | 8/2009  | Kitano et al.  | 257/98 |

FOREIGN PATENT DOCUMENTS

| JP | 2008-72141 A  | 3/2008  |
|----|---------------|---------|
| JP | 2008211255 A  | 9/2008  |
| JP | 2008263015 A  | 10/2008 |
| JP | 2009200178 A  | 9/2009  |
| JP | 2009228485 A  | 10/2009 |

* cited by examiner

*Primary Examiner* — Marc Armand
(74) *Attorney, Agent, or Firm* — Martin Fleit; Paul D. Bianco; Fleit Gibbons Gutman Bongini & Bianco PL (57) ABSTRACT

A light emitting diode is provided, comprising: a substrate; a metal wiring layer disposed on the substrate; a light emitting element provided on the metal wiring layer; wherein the light emitting element comprises: a semiconductor light emitting layer having a first semiconductor layer, an active layer, and a second semiconductor layer formed from the substrate side sequentially; a transparent insulating layer provided on the substrate side of the semiconductor light emitting layer; a first electrode part and a second electrode part provided on the substrate side of the transparent insulating layer in such a manner as being separated from each other, and joined to the metal wiring layer; a first contact part provided so as to pass through the transparent insulating layer and electrically connecting the first electrode part and the first semiconductor layer; and a second contact part provided so as to pass through the transparent insulating layer, the first semiconductor layer, and the active layer, and electrically connecting the second electrode part and the second semiconductor layer.

10 Claims, 9 Drawing Sheets

LIGHT EMITTING DIODE

The present application is based on Japanese Patent Application No. 2010-067341, filed on Mar. 24, 2010, the entire contents of which are hereby incorporated by reference.

BACKGROUND OF THE INVENTION

1. Field of the Invention

The present invention relates to a light emitting diode and further specifically relates to the light emitting diode wherein a light emitting element is provided on a metal wiring layer disposed on a substrate.

2. Description of the Related Art

Light emitting diodes (LEDs) have been used for mainly display, as a center of so-called indicators such as each kind of electronic equipment or measuring gauge.

In recent years, LEDs have a higher light emitting efficiency and there are less fear of heat generation. Therefore, light emission by flowing larger current than before has been enabled. Accordingly, use of the LEDs have been studied as light sources for smaller illumination, and a part of such LEDs is already put to practical use.

When the LED is used as the light source for illumination, luminance as large as dozens of times or more of that in a case of being used as a light source for an indicator, is necessary. Therefore, a method of securing the luminance by arranging a plurality of LED chips in an array, or a method of using a large-sized LED chip capable of flowing a large current, is used.

The aforementioned method of arranging the plurality of LED chips in an array, is used for the light source of green, red, and yellow, for example, in a traffic signal on a road. However, in this method, accurate mounting/wiring of several hundred LED chips is necessary to constitute the light source for one illumination, thus requiring much labor in manufacture and incurring higher cost.

In the method of using a large-sized LED chip that flows the large current as described above, high luminance is secured by increasing a size of 1 chip to a few millimeters square from a several hundred μm square in a case of a LED chip for display, and increasing a current to several A from several hundred mA in a case of the LED chip for display. In this method, the number of LED chips used in the light source for one illumination can be tremendously reduced, thus making it extremely easy to mount the LED chip. Focusing on such an advantage, study and development of enhancing an allowable limit value (so-called current capacity) of a quantity of current in one LED chip, has been progressed.

Further, the large-sized LED that flows the large current is considerably bright, if compared with the LED for display. However, brightness is not sufficient, if compared with a light bulb or a fluorescent light that are put to practical use as general illumination devices. Therefore, there is a request to realize LED capable of flowing a further large current in the future.

However, in order to increase the current that can be flown to the LED, a problem is not limited to the size of the LED chip which needs to be increased, and the following various problems are likely to be generated.

In a conventional LED, generally, circular electrodes are provided in a center of a surface of the LED chip. If the LED chip is increased in size, it becomes difficult to uniformly disperse and supply the current to overall LED chip from the circular electrodes. In order to uniformly disperse the current to the overall LED chip, a method of using branch-shaped wiring electrodes or transparent electrodes is known.

However, when the large current flows to the branch-shaped wiring electrodes to thereby increase a current density, breakage or deterioration occurs in the wiring electrodes by electromigration. The current that flows through such wiring electrodes are larger by two digits or three digits or more than the current that flows through an electric wire. The deterioration of the wiring electrodes is gradually progressed, thus damaging an advantage of the LEDs such that they have a long service life.

In order to prevent the breakage or deterioration of the wiring electrodes, it is effective to increase a cross-sectional area of the wiring electrodes. However, when widths of the wiring electrodes are increased to thereby increase the cross-sectional area, emitted lights are blocked by wide wiring electrodes, thus reducing a light extraction efficiency. Further, increase of heights (thicknesses) of the wiring electrodes can be considered. However, a formation process of the wiring electrodes becomes difficult and also the wiring electrodes are easily damaged when the LED chips are grasped by a collet, etc. When the wiring electrodes are damaged, an electric resistance of a damaged part becomes high, and there is a high possibility that the wiring electrodes are broken when the large current flows.

Further, a diameter of a bonding wire for a connection between the LED and a stem, needs to be thick to withstand the large current. Moreover, a stem side on which the LED chip is mounted, also needs to be formed to withstand the large current, and wiring formed of a thin film such as plating which can be utilized conventionally, can not withstand the large current.

Further, a power source for flowing the large current to the LED is necessary. However, in the power source capable of flowing the large current such as 5 A or 10 A, the cost is increased and sufficient insulation measure needs to be secured to prevent a generation of electric leakage.

In order to solve the above-described technical problem, patent documents 1 and 2 disclose a technique of connecting in series and arranging a plurality of LED chips for constituting one LED. By connecting the plurality of LED chips in series, the LED can be operated with high drive voltage and low drive current.

Further, in order to increase the light extraction efficiency of the LED, patent documents 3 and 4 disclose a technique of providing a metal light reflection layer between a semiconductor light emitting part and a substrate.

(Patent document 1) Japanese Patent Laid Open Publication No. 2008-72141
(Patent document 2) Japanese Patent Laid Open Publication No. 2008-211255
(Patent document 3) Japanese Patent Laid Open Publication No. 2009-200178
(Patent document 4) Japanese Patent Laid Open Publication No. 2008-263015

However, in the technique disclosed by the aforementioned patent documents 1 and 2, although epitaxial layers can be formed on an insulating substrate like 4 elements type LED, the epitaxial layers can not be formed on a transparent substrate. In a case of simply using a semi-insulating substrate, light emitted from an active layer toward a substrate is absorbed into a surface of the substrate, and therefore high light extraction efficiency can not be realized.

Further, in the patent documents 1 and 2, an air-bridge wiring is used in the wiring between LED chips. When the air-bridge wiring is made by wire bonding, it requires much labor and a higher cost. Therefore, in the patent documents 1 and 2, the air-bridge wiring is formed in a lump by using a photolithography. However, in this case, a sufficient cross-sectional area can be hardly obtained in wiring. When the sufficient cross-sectional area can not be obtained in the wiring, there is a higher risk of breaking the wiring by a stress of resin during resin molding. Further, in the air-bridge wiring, the wiring is set in a suspended state, and therefore efficient heat diffusion by heat conduction can not be performed, thus raising a temperature of the wiring and easily breaking the wiring due to electromigration. Therefore, a limit conduction current needs to be set to be low.

BRIEF SUMMARY OF THE INVENTION

An object of the present invention is to provide a light emitting diode capable of obtaining a high light emission output with a small drive current.

According to an aspect of the present invention, A light emitting diode is provided, comprising:

a substrate;

a metal wiring layer disposed on the substrate;

a light emitting element provided on the metal wiring layer;

wherein the light emitting element comprises:

a semiconductor light emitting layer having a first semiconductor layer, an active layer, and a second semiconductor layer formed from the substrate side sequentially;

a transparent insulating layer provided on the substrate side of the semiconductor light emitting layer;

a first electrode part and a second electrode part provided on the substrate side of the transparent insulating layer in such a manner as being separated from each other, and joined to the metal wiring layer;

a first contact part provided so as to pass through the transparent insulating layer and electrically connecting the first electrode part and the first semiconductor layer; and a second contact part provided so as to pass through the transparent insulating layer, the first semiconductor layer, and the active layer, and connecting the second electrode part and the second semiconductor layer.

DETAILED DESCRIPTION OF THE INVENTION

A light emitting diode according to an embodiment of the present invention will be described, with reference to the drawings.

Figure 1:
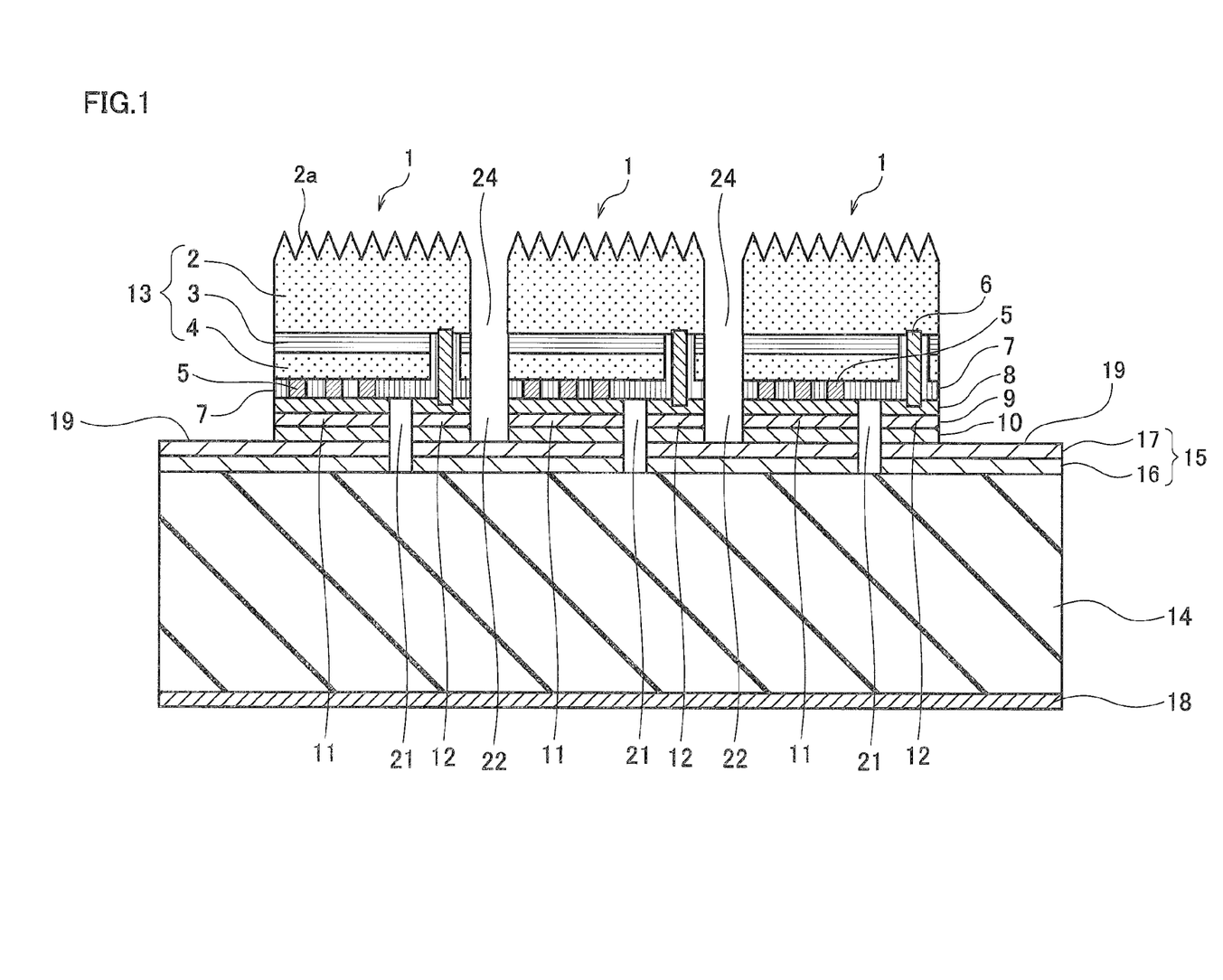
FIG. 1 is a cross-sectional view showing a light emitting diode according to an embodiment of the present invention.

FIG. 1 shows a cross-sectional view of the light emitting diode according to an embodiment of the present invention.

The light emitting diode of this embodiment comprises: a substrate 14; a metal wiring layer 15 disposed on the substrate 14; and a plurality of light emitting elements 1 provided on the metal wiring layer 15.

Each light emitting element 1 comprises: a semiconductor light emitting layer 13 having a first semiconductor layer 4, an active layer 3, and a second semiconductor layer 2 sequentially from the substrate 14 side; a transparent insulating layer 7 provided on the substrate 14 side of the semiconductor light emitting layer 13; a first electrode part 11 and a second electrode part 12 provided on the substrate 14 side of the transparent insulating layer 7 in such a manner as being separated from each other, and joined to the metal wiring layer 15; a first contact part 5 provided so as to pass through the transparent insulating layer 7 and electrically connecting the first electrode part 11 and the first semiconductor layer 4; and a second contact part 6 provided so as to pass through the transparent insulating layer 7, the first semiconductor layer 4, and the active layer 3, and electrically connecting the second electrode part 12 and the second semiconductor layer 2.

As a material of the substrate (support substrate) 14, a material having a high resistance and a high thermal conduction at a low cost is preferable. The substrate 14 does not need transparency to a light emitted from the light emitting element 1. As the substrate 14, for example, single crystal substrates made of sapphire, Si, GaN, AlN, ZnO, SiC, BN, ZnS, and a substrate made of ceramics such as $Al_2O_3$, AlN, BN, MgO, ZnO, SiC, and C, and a mixture of them can be used.

Figure 4:
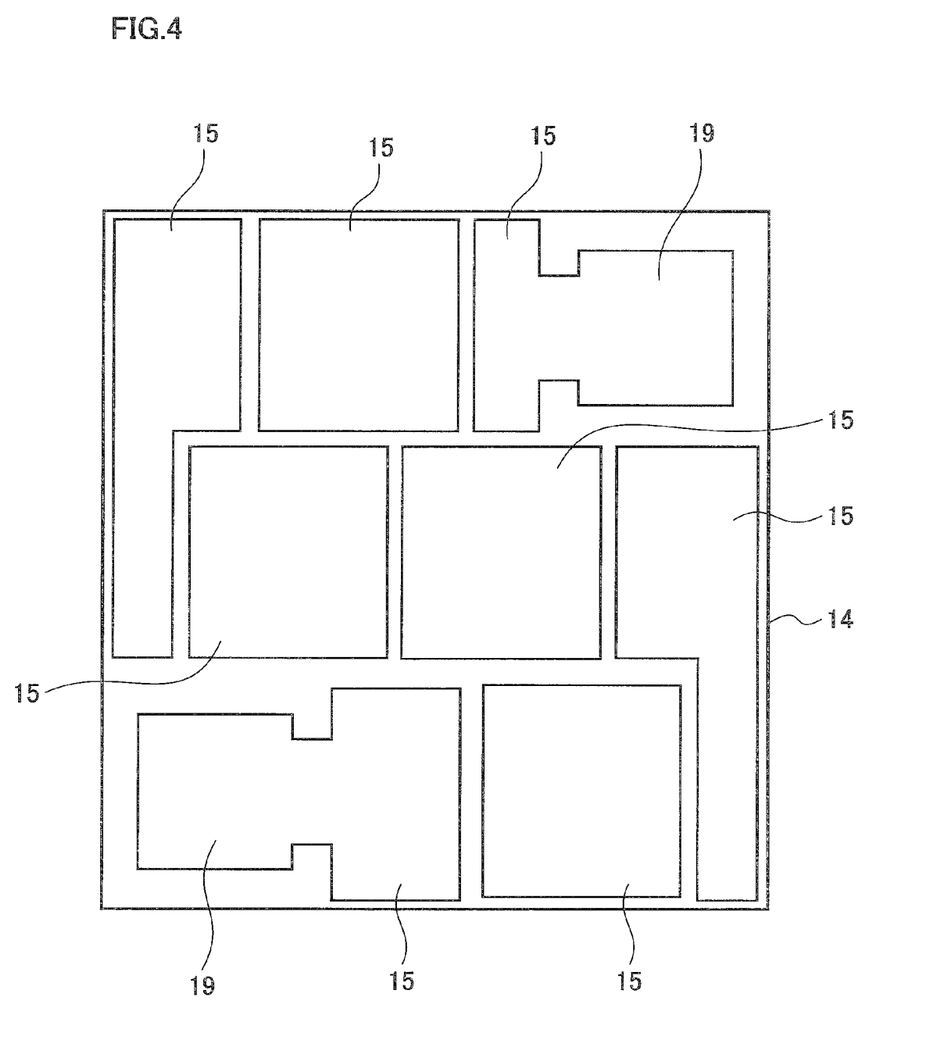
FIG. 4 is a planer view showing a substrate having an electric wiring layer used in the light emitting diode according to an example of the present invention.

The metal wiring layer 15 on the substrate 14 is composed of an adhesive layer 16 and a bonding metal layer 17 sequentially laminated from the substrate 14 side. The adhesive layer 16 is provided to strengthen an adhesion between the substrate 14 and the bonding metal layer 17. The bonding metal layer 17 is a layer bonded to the first electrode part 11 and the second electrode part 12 by thermocompression bonding, etc. The metal wiring layer 15 having a wiring pattern is formed by laminating the adhesive layer 16 and the bonding metal layer 17 on the substrate 14 by vapor deposition, and thereafter applying patterning thereto by photolithography and etching, as shown in FIG. 4 as an example. For example Ti and Pt are preferably used for the adhesive layer 16, and Au and Au-based eutectic alloy are preferably used for the adhesive layer 17.

An adhesive layer 18 for die bonding is formed on a rear face of the substrate 14, to thereby mount the light emitting diode on a stem, etc. A material with less thermal resistance is preferable for the adhesive layer 18 on the rear surface side and for example, a material capable of responding to Au—Sn eutectic bonding is preferably used.

In this embodiment, the semiconductor light emitting layer 13 of the light emitting element 1 has a structure that the active layer 3 is sandwiched from both sides by the first semiconductor layer 4, being a p-type clad layer, and the second semiconductor layer 2, being a n-type clad layer. As an example, the semiconductor light emitting layer 13 is formed by growing epitaxial layers including the semiconductor light emitting layer 13 on the substrate for growth by metal-organic vapor phase epitaxy (MOVPE). A face of an opposite side to the active layer 3 of the second semiconductor layer 2 is formed into a light extraction surface 2a which is subjected to surface-roughening, to thereby enhance the light extraction efficiency. In addition, an electrode is not formed on the light extraction surface 2a, and therefore the light extraction efficiency is high.

In each light emitting element 1, first electrodes 11, being p-side electrodes connected to the first semiconductor layer 4, and second electrodes 12, being n-side electrodes connected to the second semiconductor layer 2, are provided on the substrate 14 side of the transparent insulating layer 7 so as to be partitioned by prescribed separation grooves 21 and 22, side by side flatly with their heights aligned with each other. Thus, the light emitting element 1 can be surely easily mounted on the metal wiring layer 15 formed on the surface of the substrate 14.

The first contact part 5 is formed by providing Au-based metal, etc, into a hole formed so as to pass through the transparent insulating layer 7. The second contact part 6 is formed by providing the Au-based metal, etc, into a hole formed so as to pass through the transparent insulating layer 7, the first semiconductor layer 4 and the active layer 3. Further, in order to electrically insulate between the first semiconductor layer 4, the active layer 3, and the second contact part 6, a circumference of the Au-based material of the second contact part 6 is covered and insulated with an insulating material such as SiO2, etc.

Figure 2:
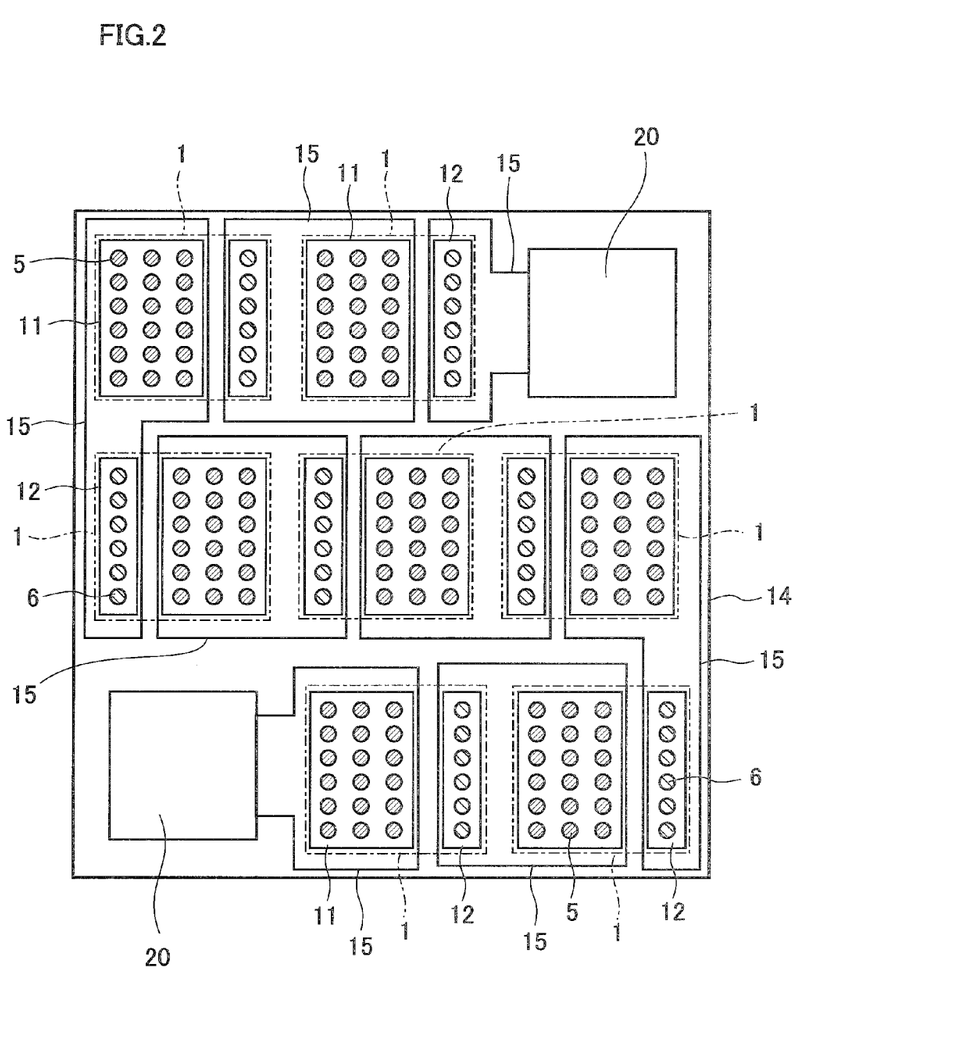
FIG. 2 is a view showing a connecting relation among a plurality of light emitting elements in the light emitting diode according to an embodiment of the present invention.

In this embodiment, as shown in FIG. 2, a plurality of first contact parts 5 and second contact parts 6 are formed in dot shapes in each light emitting element 1. Note that the plurality of first and second contact parts may not be formed into dot shapes but may be formed into annular shapes or branch shapes continuously.

In this embodiment, each first electrode part 11 and each second electrode part 12 are constituted of a reflection metal layer 8, a diffusion inhibiting layer 9, and a bonding metal layer (bonding layer) 10, sequentially from the side of the transparent insulating layer 7.

The metal reflection layer 8 is a layer for improving the light extraction efficiency by reflecting the light toward the semiconductor light emitting layer 13, the light being emitted from the active layer 4 to the transparent insulating layer 7 side, and a material having a high reflectivity to a light with a light emission wavelength, is used. Metal such as Au, Ag, Cu, and Al, or an alloy including at least one metal of them is used for the metal reflection layer 8.

The diffusion inhibiting layer 9 is a layer for inhibiting a diffusion of a material toward the metal reflection layer 8, the material constituting the bonding metal layer 10, etc, on the substrate 14 side of the metal reflection layer 8, to thereby inhibit a reduction of reflection characteristics of the metal reflection layer 8, and for example, Ti, Pt is used.

The bonding metal layer 10 is a layer bonded to a bonding metal layer 33 of the metal wiring layer 15 by thermocompression bonding or eutectic bonding, etc, and as a material of the bonding metal layer 10, Au or Au-based eutectic alloy is preferably used.

The first electrode part 11 and the second electrode part 12 are formed in such a manner that for example the reflection metal layer 8, the diffusion inhibiting layer 9 and the bonding metal layer 10 are formed by vapor deposition, and thereafter patterning is applied thereto so as to separate the first electrode part 11 and the second electrode part 12.

In this embodiment, seven light emitting elements 1 are connected in series as shown in FIG. 2 over the metal wiring layer 15 disposed on the substrate 14 as shown in FIG. 4. Namely, as shown in FIG. 2, pad electrodes 20 are formed on two metal wiring layers 15 which are located in diagonal positions on a rectangular substrate 14, and a voltage is applied between these two pad electrodes 20 and 20, so that a current flows through seven light emitting elements 1 which are connected in series in a S-shape, through a plurality of metal wiring layers 30. Specifically, a flow of the current between the adjacent light emitting elements 1 and 1 connected in series is as follows. The current supplied from the metal wiring layer 15 connected to the first electrode part 11 of any one of the light emitting elements 1, is supplied to the first semiconductor layer 4 through the first electrode part 11 and the first contact part 5 of the light emitting element 1. The current supplied to the first semiconductor layer 4 flows to the second electrode part from the second contact part 6 through the first semiconductor layer 4, the active layer 3, and the second semiconductor layer 2. Further, the current flown to the second electrode part 12, flows to the first electrode part 11 of the adjacent light emitting elements 1 which are connected in series to the light emitting element 1 from the second electrode part 12 through the metal wiring layer 15.

According to this embodiment, one or a plurality of effects shown below can be obtained.

(1) A plurality of light emitting elements are connected in series, and therefore higher output or higher luminance is achieved by driving the plurality of light emitting elements 1 by small drive current. Further, since the light emitting elements 1 can be driven by small drive current, a cross-sectional area of electrodes, wiring, and bonding wire, etc, can be made small, and a drive power source, a drive circuit, can also be kept to respond to the small drive current.

(2) In a conventional flip-chip bonding using a bump, amount or height of each bump of the plurality of light emitting elements is hardly controlled, thus easily generating a bonding failure. However, in this embodiment, a planar joint structure (bonding structure) is used, wherein a flat surface of the metal wiring layer 15 formed on the substrate 14, and surfaces of the first electrode part 11 and the second electrode part 12 of the light emitting elements 1 which are formed flatly with their heights aligned, are bonded planarly by thermocompression bonding, etc. Therefore, bonding is facilitated and a generation of the bonding failure can be suppressed.

(3) The metal wiring layer 15 is directly provided on the substrate 14. Therefore, a breakage due to a stress of resin during molding hardly occurs, compared with a conventional wiring structure of an air-bridge, and a heat generated from the light emitting element 1 is allowed to efficiently escape toward the substrate 14. Further, a length of the metal wiring layer 15 between the light emitting elements 1 can be shortened, and a width between them can be taken wider. Therefore, an electric resistance can be made small, and a large current can be flown even in a case of a thin metal wiring layer 15.

(4) A plurality of light emitting elements 1 can be bonded to the substrate 14 collectively by a wafer bonding system. Therefore, a manufacturing cost of the light emitting diode can be reduced.

(5) The first electrode part 11 and the second electrode part 12 of the light emitting element 1 are both provided on the substrate 14 side, and electrodes or air-bridge wiring does not exists on the light extraction surface side of the light emitting element 1. Therefore, the light extraction efficiency is high and the generation of the heat due to re-absorption of the light can be suppressed.

(6) The metal reflection layer 8 is provided between the semiconductor light emitting layer 13 and the substrate 14. Therefore, not only the substrate transparent to the light having the light emission wavelength, but also the substrate that absorbs the light having the light emission wavelength can be used. Therefore, application to the 4 elements type LED such as AlGaInP LED, etc, and infrared LED such as GaAs LED, is also possible. Further, the substrate needs not to have a transparency, and therefore a substrate that prioritize characteristics such as thermal conductivity or electric insulation property can be selected, or a substrate in consideration of a material cost can be comprehensively selected.

(7) Metal has generally high linear expansion coefficient due to heat. Therefore, a large internal stress is easily added to the semiconductor light emitting layer 13, by a difference in the linear expansion coefficient between the semiconductor light emitting layer 13 and the joint part at the substrate 14 side of the light emitting element 1. Particularly, when a total area of the joint part becomes large, the internal stress of the semiconductor light emitting layer 13 becomes large. However, in the light emitting diode of this embodiment, a dimension of an outer shape of each light emitting element 1 can be made small. Therefore, the internal stress can be suppressed to be small, and the light emitting diode with high reliability can be realized.

(8) In light emitting diodes with different emission colors, such as red LED and blue LED, a drive voltage is also different. Therefore, when light emitting diode chips with different emission colors are driven by using power sources of the same voltage, electric resistance corresponding to the difference of the drive voltage is added to a power source circuit, etc, thereby generating power loss. However, according to the light emitting diode of this embodiment, even in a case of the LED with different emission color, almost the same drive voltage can be used, thus making it possible to tremendously suppress the power loss.

[Other Embodiments]

Figure 8:
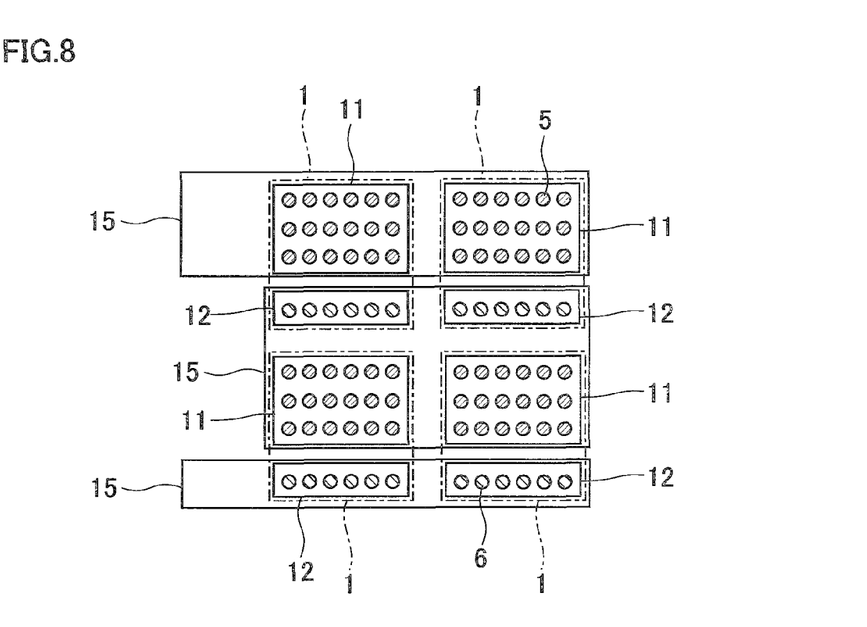
FIG. 8 is a view showing a connecting relation among a plurality of light emitting elements in a light emitting diode according to other embodiment of the present invention.

In the above-described embodiment, explanation is given for the light emitting diode wherein a plurality of light emitting elements 1 are connected in series. However, the plurality of light emitting elements 1 may be connected in parallel, or may be connected in series-parallel connection. In FIG. 8, as an example of the series-parallel connection, an electrode and wiring structure is shown, wherein two light emitting elements 1 connected in series at the right side, and two light emitting elements 1 connected in series at the left side, are connected in parallel.

Figure 9:
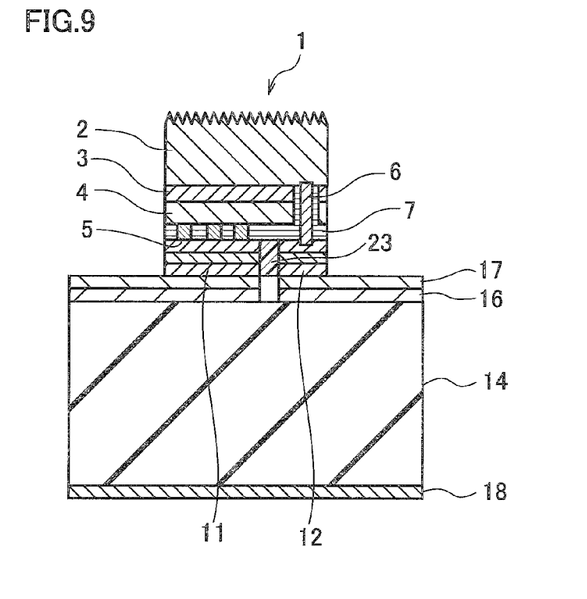
FIG. 9 is a cross-sectional view showing a light emitting diode according to other embodiment of the present invention.

In the above-described embodiment, explanation is given for the light emitting diode wherein a plurality of light emitting elements are connected in series. However, as shown in FIG. 9, 1 element type light emitting diode wherein one light emitting element 1 is formed on the substrate 14 may also be acceptable as the light emitting diode of the present invention. In this embodiment, as shown in FIG. 9, an insulator 23 is provided between the first electrode part 11 and the second electrode part 12, to thereby further increase insulating property.

Figure 10:
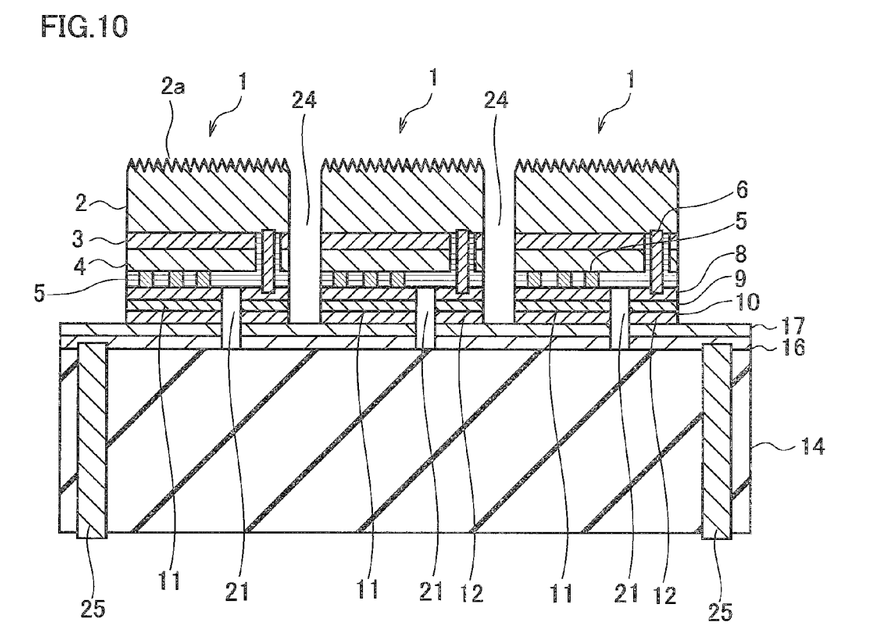
FIG. 10 is a cross-sectional view showing a light emitting diode according to other embodiment of the present invention.

Further, as shown in FIG. 10, a through hole is formed in the substrate 14, and by filling the through hole with a conductive material, a rear surface contact part 25 electrically connected to the metal wiring layer 15 may also be formed. By using the rear surface contact part 25, there is no necessity for providing an area of pad electrodes on the metal wiring layer 15, and therefore miniaturization of the LED is achieved. Further, when the LED is miniaturized, wire bonding with high accuracy is necessary. However, by having the rear surface contact part 25, the step of wire bonding can be eliminated, and therefore further simplification is achieved in an electrode part and the structure or connection of wiring, thus facilitating its handling even in a case of the 1 element type light emitting diode.

Further, in the light emitting diode of this embodiment, the light emitting element having AlGaInP-related semiconductor light emitting layer is formed on the substrate 14. However, the present invention can be applied to a light emitting diode wherein the light emitting element having AlGaAs-related or GaN-related semiconductor light emitting layer is formed on the substrate 14.

Further, in the aforementioned embodiment, conductivity type of n-type, p-type may be formed reversely.

EXAMPLES

The light emitting diode having a structure similar to the aforementioned embodiment was manufactured.

Dimensions of an outer shape of this light emitting diode were set to 1 mm×1 mm, and about 200 μm (thickness). Further, the outer shape of each light emitting element 1 was set to 320 μm×320 μm. The dimension of the bonding pad electrode 20 was set to 100 μm×100 μm.

(Manufacture of an Epitaxial Wafer for LED with Electrodes)

Figure 3:
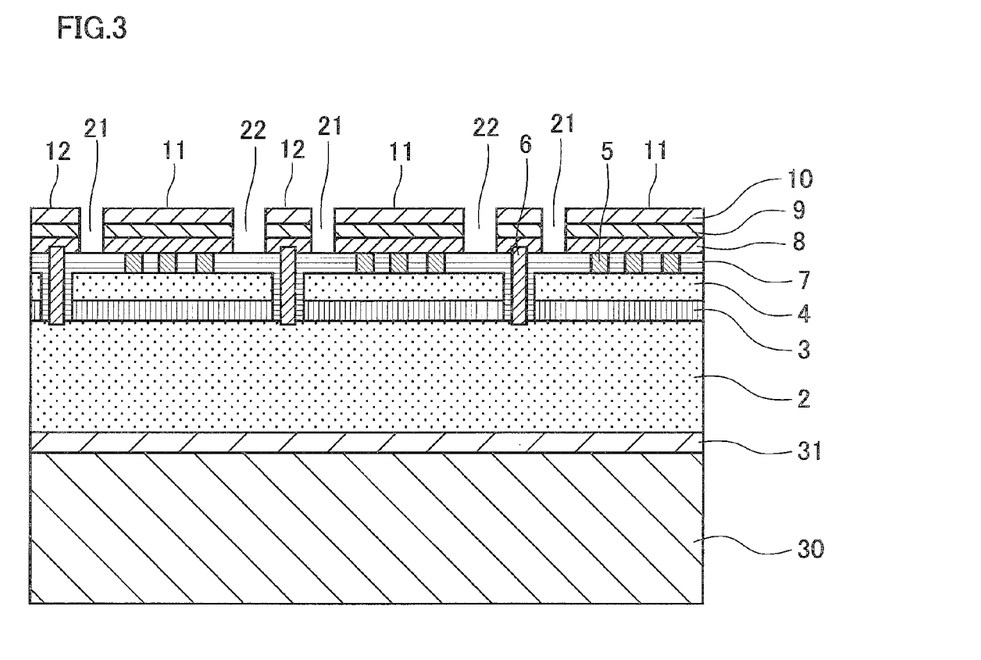
FIG. 3 is a cross-sectional view showing an epitaxial wafer for LED with electrodes used in the light emitting diode according to an example of the present invention.

As shown in FIG. 3, first, AlGaInP-related epitaxial layers composed of four layers were grown on a substrate 30 composed of n-type GaAs, being an epitaxial growing substrate by MOVPE method, to thereby form an epitaxial wafer for LED. Namely, an etching stop layer 31, the second semiconductor layer 2, being a n-type AlGaInP clad layer, the active layer 3 having a quantum well structure of AlGaInP, and the first semiconductor layer 4, being a p-type AlGaInP clad layer, are sequentially formed on the substrate 30. In order to obtain a further excellent electric contact, a contact layer capable of obtaining a low contact resistance with high carrier concentration is preferably provided at the n-type semiconductor layer side and at the p-type semiconductor layer side. Further, in order to increase current dispersibility, then increase light emitting efficiency, and decrease drive voltage, it is effective to provide a current dispersion layer with low resistance, between the clad layer and the contact layer.

Subsequently, a hole for forming the second contact part 6 that passes through the active layer 3 and the first semiconductor layer 4, was formed by a photolithography process and an etching process. Then, the transparent insulating layer 7 made of $SiO_2$ was formed on the first semiconductor layer 4. At this time, the transparent insulating layer made of $SiO_2$ is also formed on an inner wall surface of the hole for the second contact part 6 which is formed in the aforementioned step. However, at this time, $SiO_2$ is also deposited on a bottom of the hole for the second contact part 6, and therefore at this time point, the hole for the second contact part 6 does not reach the second semiconductor layer 2.

Subsequently, a hole for forming the first contact part 5 that passes through the transparent insulating layer 7, was formed by the photolithography process and the etching process. At this time, simultaneously, SiO$_2$ deposited on the bottom of the second contact part 6 was removed, so that the hole for the second contact part 6 reached the second semiconductor layer 2.

In this example, diameters of the holes for the first contact part 5 and the second contact part 6 were set so that a current of 50 mA could be flown through the contact parts 5 and 6 without trouble. Specifically, if the diameter is set to 5 μm, 40 or more contact parts are necessary, or if the diameter is set to 10 μm, 10 or more contact parts are necessary. However, it is easier to achieve high luminance if a plurality of contact parts with small diameters are provided.

Subsequently, the first contact part 5 and the second contact part 6 were formed by filling inside of the hole with Au-based metal, by vapor deposition and lift-off of the photolithography process. At this time, heights of the first contact part 5 and the second contact part 6 were formed so as to be almost the same as the surface of the transparent insulating layer 7. A formation material and a structure are different between the first contact part 5 and the second contact part 6. Therefore, they were formed in separate steps respectively. As an example, the first contact part is formed by laminating AuBe layer (ohmic contact layer)/Ni layer (diffusion inhibiting layer)/Au layer (bonding layer), from the first semiconductor layer 4 side. As an example, the second contact part is formed by laminating AuGe layer (ohmic contact layer)/Ni layer (diffusion inhibiting layer)/Au layer (bonding layer), from the second semiconductor layer 2 side.

Subsequently, as a metal layer constituting the first electrode part 11 and the second electrode part 12, the metal reflection layer 8 made of Au, the diffusion inhibiting layer 9 made of Ti, and the bonding metal layer made of Au, were sequentially formed by vapor deposition from the transparent insulating layer 7 side. Thereafter, separation grooves 21, 22 were formed in the metal reflection layer 8, the diffusion inhibiting layer 9, and the bonding metal layer 15 by the photolithography process and the etching process, for separating the metal layer into the first electrode 11 and the second electrode 12. The separation groove 21 is a groove for separating the metal layer into the first electrode 11 and the second electrode 12 in each light emitting element 1, and the separation groove 22 is a groove for separating the metal layer into the first electrode 11 and the second electrode 12 between adjacent light emitting elements 1 and 1. Thereafter, an alignment mark is formed on the rear surface of the substrate (substrate for growth) 30, so as to be used for bonding thereto the substrate (support substrate) having the electric wiring layer.

Thus, the epitaxial wafer for LED with electrodes shown in FIG. 3 was formed.

(Manufacture of the Substrate Having the Electric Wiring Layer)

As the substrate 14, being the support substrate of the light emitting element 1, silicon (Si) substrate with high resistance was used, from the necessity for electrically separating into a plurality of light emitting elements 1. Alternatively, as the substrate 14, in order to reduce the thermal resistance of the substrate, a substrate having an insulating film such as SiO$_2$ formed on the surface of the substrate with high carrier concentration, may also be used.

Then, the adhesive layer 16 made of Ti and the bonding metal layer 17 made of Au were sequentially formed on the surface of the substrate 14 by vapor deposition, and thereafter the adhesive layer 16 and the bonding metal layer 17 were subjected to patterning by using the photolithography and the etching, to thereby form the metal wiring layer 15 having the wiring pattern as shown in FIG. 4. The alignment mark used for bonding was also formed on the rear surface of the substrate 14.

(Bonding Between the Epitaxial Wafer for LED with Electrodes and the Substrate)

Figure 5:
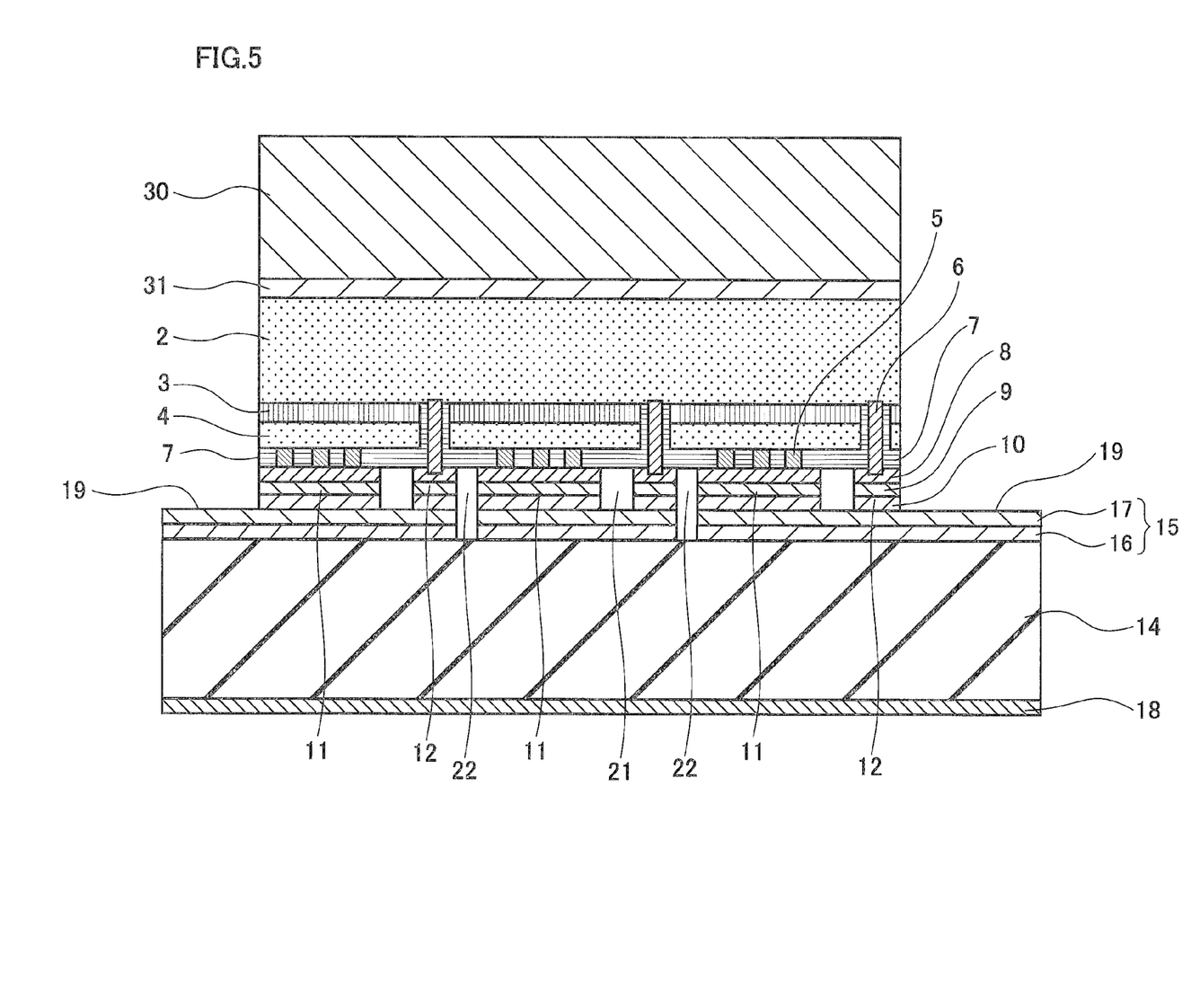
FIG. 5 is a cross-sectional view showing a state that the epitaxial wafer for LED with electrodes of FIG. 3 and the substrate having the electric wiring layer of FIG. 4 are bonded with each other.

The epitaxial wafer for LED with electrodes shown in FIG. 3, and the substrate 14 shown in FIG. 4 manufactured as described above were aligned with each other as shown in FIG. 5, by using mutual alignment marks and bonded with each other by thermocompression bonding.

In this bonding step, a bonding device (not shown) with an alignment function for micro machine was used. The bonding metal layer 10 of the first electrode 11 and the second electrode 12 of the epitaxial wafer for LED with electrodes, and the bonding metal layer 17 of the metal wiring layer 15 of the substrate 14 were set in a state of being opposed to each other in the bonding device, to thereby obtain a high vacuum state first. Then, the epitaxial wafer for LED with electrodes and the substrate 14 were adhered to each other by adding a uniform pressure between them, and thereafter temperature rise was started. When the temperature reached 350° C., the temperature was maintained for about 1 hour. Then, the temperature was decreased, and when the temperature was sufficiently decreased, pressurization was released, to thereby return inside of the bonding device to atmospheric pressure, and a bonding wafer for LED, which was already bonded, was taken out.

(Removal of the Substrate for Growth and Surface-roughening of the Light Extraction Surface)

Next, the aforementioned bonding wafer for LED was bonded to a lapping plate (not shown), so that the side of the substrate 30 for growth was positioned at the front side, and the substrate 30 was ground and removed by lapping.

Figure 6:
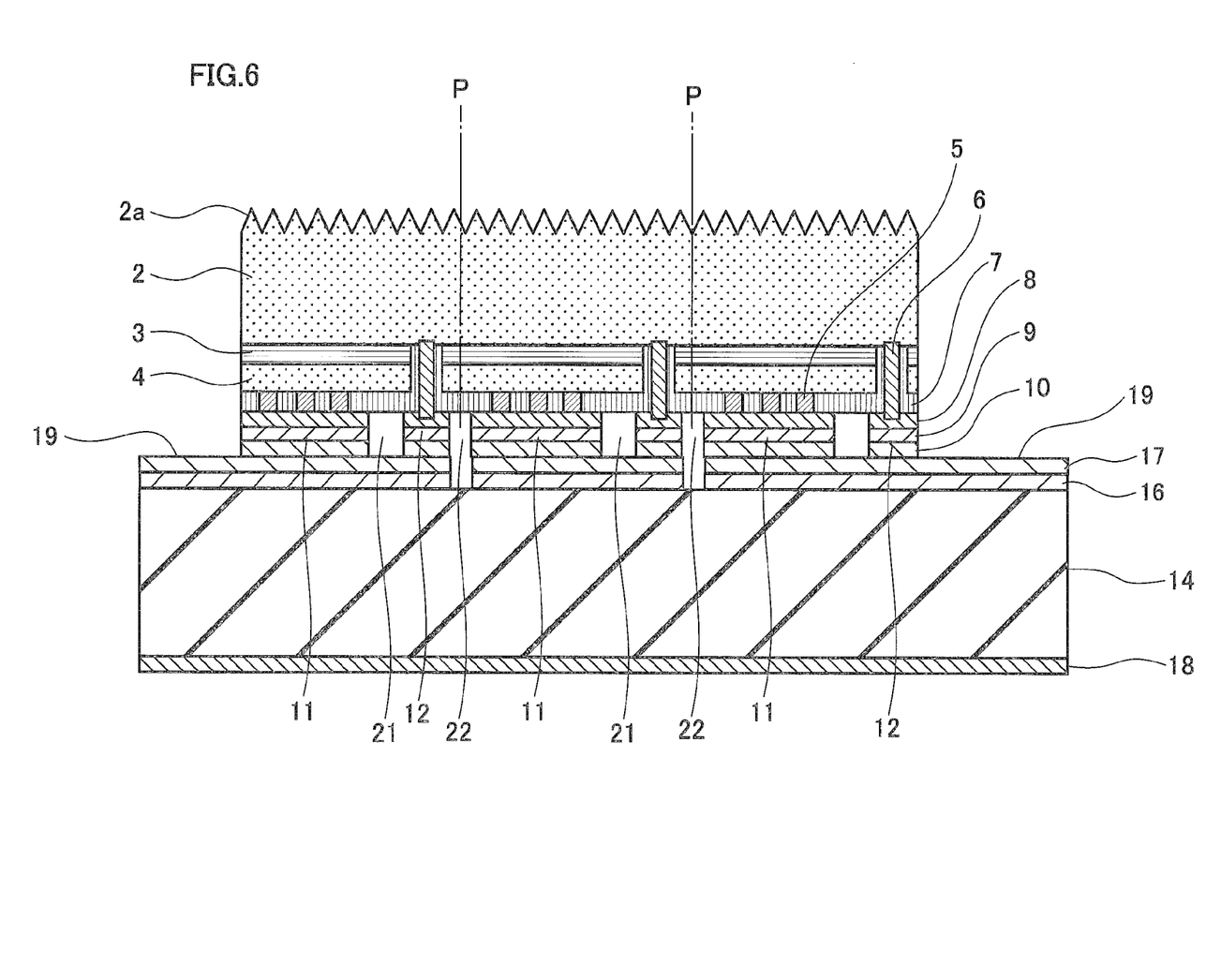
FIG. 6 is a cross-sectional view showing a state that a light extraction surface is subjected to surface-roughening, after a substrate for growth is removed from a bonding wafer of FIG. 5.

When a remaining thickness of the substrate 30 was 30 μm, lapping was stopped, and the bonding wafer for LED was removed from the lapping plate. Thereafter, the bonding wafer for LED was immersed into an etching solution for removing GaAs, and remained GaAs substrate was completely removed. At this time, since an etching stop layer 31 is provided, progress of the etching is stopped when GaAs is completely removed. As the etching solution for removing GaAs, for example, a mixture liquid of ammonia water and hydrogen peroxide solution can be used. Thereafter, the etching stop layer 31 is removed by using another etching solution. For example, when the etching stop layer 31 is composed of GaInP, chlorine-based etching solution can be used for etching.

Subsequently, as shown in FIG. 6, surface-roughened light extraction surface 2a composed of a plurality of conical projections having acute angles was formed on the surfaces of the second semiconductor layer 2 which was exposed by removing the GaAs substrate 19 and the etching stop layer 31. As a formation method of the light extraction surface 2a, more specifically, there is a method of forming a resist mask pattern of the conical projection by photolithography using photomask, etc, and thereafter forming the conical projection by dry-etching.

(Formation of Element Separation Grooves and Chipping)

Subsequently, by processing the bonding wafer from which the aforementioned GaAs substrate 30 and the etching stop layer 31 were removed, the epitaxial layers were separated into each light emitting element 1 by etching, and further the wafer was cut into chips in every light emitting elements 1.

Specifically, first, by forming an element separating groove 24 with a width of about 10 μm at position P shown by one dot chain line in FIG. 6, by the photolithography and etching, the epitaxial layers were separated into each light emitting element 1 of 320 μm square. Further, simultaneously with a formation of the element separating groove 24, a bonding pad portion 19 for wire bonding was also formed by exposing the surface of the bonding metal layer 17. Since the bonding pad portion 19 is formed through several steps, its adhesion is improved during wire bonding and shear strength can be further increased by further providing a pad electrode on the surface.

Next, the adhesive layer 18 for die-bonding was formed on the rear surface of the substrate 14, so that the light emitting diode could be surely fixed to the stem, etc, during die-bonding. The adhesive layer for Au—Sn eutectic bonding with low thermal contact resistance was used as the adhesive layer 18, for obtaining excellent radiation performance. Thereafter, a groove for cutting (not shown) was formed in the epitaxial layers by etching at specified pitches, so that one light emitting diode includes a prescribed plurality of light emitting elements 1, and in this groove for cutting, the support substrate 14 was cut by using a dicing blade, to thereby covert the substrate into chips of the light emitting diode with 1 mm square. In the dicing at this time, in order to prevent the dicing blade with a width of about 30 μm from being brought into contact with the epitaxial layers, the width of the groove for cutting was set to 50 μm with a margin.

(Evaluation of the Light Emitting Diode)

The light emitting diode (bare chip) according to this example manufactured as described above, was mounted on the stem (not shown), and after wiring is made with the pad electrode by wire bonding, molding was applied thereto with transparent resin made of silicone. Then, this light emitting diode was fixed to a heat dissipation jig, and the light emitting diode was energized, to thereby measure and evaluate light emitting performance and electric characteristics. As a result, it was confirmed that light with a dominant wavelength of 625 nm and light emitting power of 410 W was outputted, with a drive voltage of 14V and a drive current of 50 mA in a forward direction.

In order to compare light emitting diodes of this example and that of a comparative example, the light emitting performance and the electric characteristics of a light emitting diode of the comparative example with an upper and lower electrode structure (similar structure as the light emitting diode described in the patent document 4) were also measured. Although not shown, the light emitting diode of the comparative example is a light emitting diode having a structure that the Si substrate and the epitaxial layers having a light emitting layer portion are bonded with each other through the metal bonding layer, wherein a light reflection metal layer for reflecting light toward the epitaxial layers is provided. Further, a circular pad electrode and line electrodes that extend from the circular pad electrode are provided on an upper surface of the epitaxial layers. In this comparative example, in order to set a condition to be same as a condition of the aforementioned example, an outer shape dimension of the light emitting diode was set to 1 mm square.

A light emitting power of the light emitting diode of this comparative example was 239 mW when a current of 350 mA was supplied thereto. A voltage in a forward direction at this time was 2.29V. Namely, in order to obtain the light emitting power equivalent to that of the light emitting diode of this example, a current of 500 mA or more was necessary. However, when such a large current is flown, various problems such as deterioration of the epitaxial layers due to heat generation or breakage of the line electrodes are likely to occur. Therefore, the light emitting diode of this comparative example is hardly applied to the light emitting diode for illumination with high luminance.

Thus, according to the light emitting diode of this example, a plurality of light emitting elements 1 are connected in series, and therefore it is confirmed that although the drive voltage inputted into an overall light emitting diode becomes high, a high light emitting power can be obtained with low drive current.

Further, there is no air-bridge wiring or bonding electrodes, etc, for cutting off an emission of the light. Therefore the light extraction efficiency can be improved and high light emission efficiency can be realized.

Other Examples

The light emitting diode of the aforementioned example has a structure that the light emitting element having the AlGaInP-related semiconductor light emitting layer on the substrate. However, the present invention can also be applied to the light emitting diode having GaN-related light emitting element formed thereon. In this case, a basic structure of the light emitting diode is almost the same as that of the aforementioned example. However, a different point from the aforementioned example will be described hereafter, by giving an example of the light emitting diode having the GaN-related light emitting element.

A sapphire substrate is used instead of the GaAs substrate 30, being a substrate for growth used in the aforementioned example. Undoped GaN buffer layer with a thickness of about 4 μm, n-type GaN clad layer with a thickness of 3 μm and carrier concentration of $1.0 \times 10^{19} [\text{cm}^{-3}]$, 5 to 6 pairs of quantum well type InGaN active layers, p-type AlGaN clad layer with a thickness of 30 to 40 nm, and p-type GaN layer with a thickness of 200 to 300 nm and carrier concentration of $1.0 \times 10^{18} [\text{cm}^{-3}]$ are formed on the sapphire substrate, to thereby manufacture the epitaxial wafer. Further, the transparent conductive film made of ITO, the metal reflection layer made of Ag, and the transparent insulating layer made of $SiO_2$ are sequentially formed on the epitaxial layers, and thereafter the first contact part and the second contact part made of NiAu are formed, and also the first electrode and the second electrode are formed on the transparent insulating layer, to thereby manufacture the GaN-related epitaxial wafer for LED with electrodes. The GaN-related epitaxial wafer with electrodes and the support substrate having the metal wiring layer are bonded with each other. Removal of the sapphire substrate by a laser peeling method and dicing, etc, are performed to the bonded wafer, to thereby obtain the light emitting diode wherein a plurality of GaN-related light emitting elements are connected in series.

Figure 7:
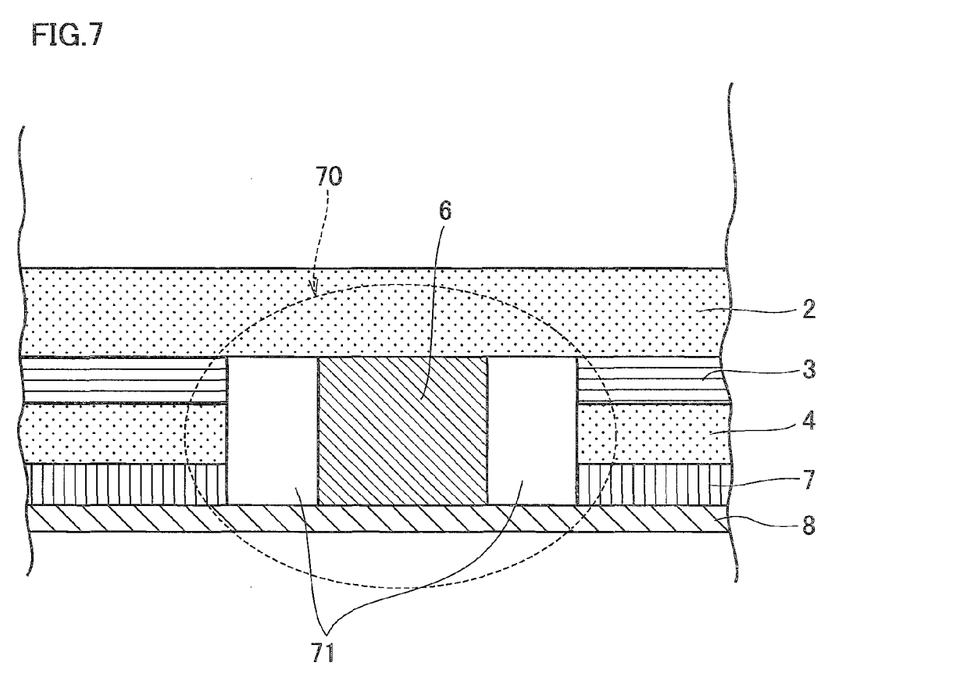
FIG. 7 is a cross-sectional view showing an expanded second contact part and its neighborhood in a light emitting diode according to other example of the present invention.

The hole for forming the first contact part 5 and the second contact part 6 has a diameter of about 5 to 10 μm, and meanwhile, a thickness of the epitaxial layers having the hole therein is about 1 μm (aspect ratio of the hole is about 0.1 to 0.2). Accordingly, for example, as shown in FIG. 7 in which a second contact part 6 and its neighborhood area 70 are extracted and expanded, the second contact part 6 can be provided in the hole formed so as to pass through the transparent insulating layer 7, the first semiconductor layer 4, and the active layer 3 in a non-contact state with the first semiconductor layer 4 and the active layer 3, having a space 71 formed between them, even though its circumference is not covered with an insulating material.

Further, in the above-described example, the first electrode part 11 and the second electrode part 12 were formed at the light emitting element 1 side, and the metal wiring layer 15 was formed at the support substrate 14 side. However, the first electrode part, the second electrode part, and further the metal wiring layer are formed at the light emitting element side, and thereafter the light emitting element having the metal wiring layer and the support substrate may be bonded with each other.

Figure 11:
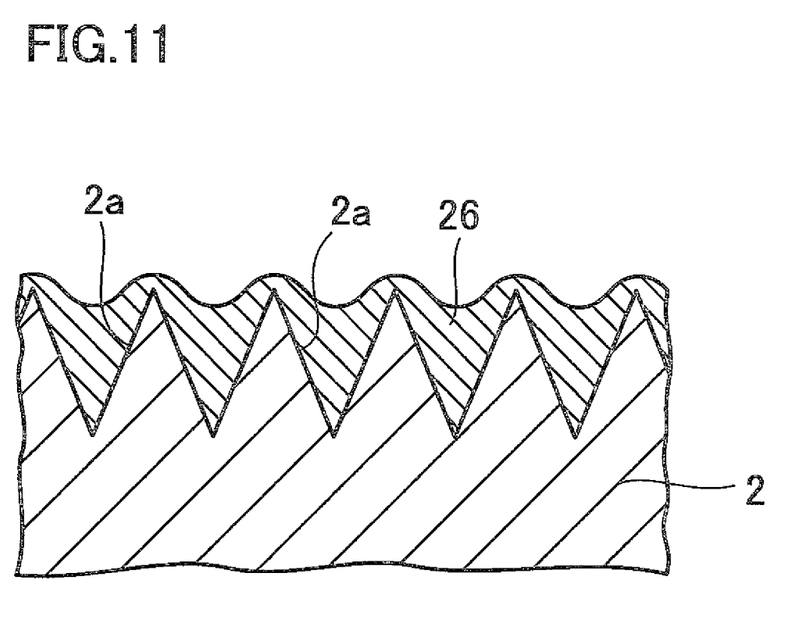
FIG. 11 is a cross-sectional view expanding a part of a light extraction surface in a light emitting diode according to other example of the present invention.

Further, in order to disperse the current to an overall area of the light emitting element 1, it is effective to form a conductive film 26 having light transmission property such as an ITO (indium oxide tin) film or a thin metal film as shown in FIG. 11 on the front surface of the surface-roughened light extraction surface 2a. Specifically, after the surface-roughened light extraction surface 2a is formed, the ITO film, being the conductive film 26, is formed to have an average thickness of 0.1 μm by, for example, a sputtering method, so as to cover acute irregularities of the light extraction surface 2a. By providing the conductive film having transparency, the surface 2a of the semiconductor layer having acute irregularities is protected, and also an outermost surface of the light extraction surface is formed into a smooth waveform curved surface, thereby making it possible to expect an improvement of the light extraction efficiency by a lens effect. Further, by forming, for example, a transparent film made of $SiO_2$ or $Si_3N_4$, having smaller refractive index than that of the ITO, further improvement of the light extraction efficiency may be achieved.

Further, by forming an insulating film on a side face of each light emitting element 1, preferably p-n junction plane is protected.

What is claimed is:

1. A light emitting diode, comprising:
    a substrate;
    a metal wiring layer disposed on the substrate;
    a light emitting element provided on the metal wiring layer;
    wherein the light emitting element comprises:
    a semiconductor light emitting layer having a first semiconductor layer, an active layer, and a second semiconductor layer formed from the substrate side sequentially;
    a transparent insulating layer provided on the substrate side of the semiconductor light emitting layer;
    a first electrode part and a second electrode part provided on the substrate side of the transparent insulating layer in such a manner as being separated from each other, and joined to the metal wiring layer;
    a first contact part provided so as to pass through the transparent insulating layer and electrically connecting the first electrode part and the first semiconductor layer; and
    a second contact part provided so as to pass through the transparent insulating layer, the first semiconductor layer, and the active layer, and electrically connecting the second electrode part and the second semiconductor layer.

2. The light emitting diode according to claim 1, wherein a plurality of light emitting elements are provided on the metal wiring layer.

3. The light emitting diode according to claim 1, wherein the first electrode part and the second electrode part have a metal reflection layer for reflecting light from the semiconductor light emitting layer.

4. The light emitting diode according to claim 1, wherein an insulator is provided between the first electrode part and the second electrode part provided so as to be separated from each other.

5. The light emitting diode according to claim 1, wherein the first electrode part and the second electrode part have a bonding metal layer, and are joined with the metal wiring layer through the bonding metal layer.

6. The light emitting diode according to claim 1, wherein the second contact part is provided on the second electrode part, and is made of an insulating material for insulating from the first semiconductor layer and the active layer, and is also made of an Au-based material provided so as to be covered with the insulating material.

7. The light emitting diode according to claim 1, wherein a surface of an opposite side to the active layer of the second semiconductor layer is a light extraction surface which is subjected to surface-roughening process.

8. The light emitting diode according to claim 1, wherein a rear surface contact part is formed, so as to be electrically connected to the metal wiring layer by forming a through hole in the substrate and providing a conductive material into the through hole.

9. The light emitting diode according to claim 2, wherein the metal wiring layer is formed into a pattern in which the plurality of light emitting elements are connected in series.

10. The light emitting diode according to claim 7, wherein a conductive film having a translucency is formed on the light extraction surface.

* * * * *